United States Patent [19]

Nakamura

[11] Patent Number: 5,517,758
[45] Date of Patent: May 21, 1996

[54] PLATING METHOD AND METHOD FOR PRODUCING A MULTI-LAYERED PRINTED WIRING BOARD USING THE SAME

[75] Inventor: Tsuneshi Nakamura, Hirakata, Japan

[73] Assignee: Matsushita Electric Industrial Co., Ltd., Osaka, Japan

[21] Appl. No.: 128,825

[22] Filed: Sep. 28, 1993

[30] Foreign Application Priority Data

May 29, 1992 [JP] Japan .................................. 4-138361
Sep. 29, 1992 [JP] Japan .................................. 4-259548

[51] Int. Cl.$^6$ ............................ H05K 3/42; H05K 3/38; H05K 3/46
[52] U.S. Cl. .............. 29/852; 29/DIG. 16; 29/DIG. 36; 174/266; 216/35; 216/36; 427/97; 427/98
[58] Field of Search ................ 29/846–849, 852, 29/853, DIG. 12, DIG. 16, DIG. 36; 174/262, 263, 266; 156/645, 656; 427/96–98; 428/901; 216/18, 35, 36

[56] References Cited

U.S. PATENT DOCUMENTS

| | | | |
|---|---|---|---|
| 3,745,095 | 7/1973 | Chadwick et al. | 174/266 X |
| 3,930,807 | 1/1976 | Kobayashi | 29/195 |
| 4,389,771 | 6/1983 | Cassidy et al. | 29/846 |
| 4,752,499 | 6/1988 | Enomoto | 427/98 |
| 4,774,122 | 9/1988 | Adler | 216/36 X |
| 5,055,321 | 10/1991 | Enomoto | 427/98 |
| 5,347,712 | 9/1994 | Yasuda et al. | 29/852 |

FOREIGN PATENT DOCUMENTS

| | | |
|---|---|---|
| 0197323 | 10/1986 | European Pat. Off. . |
| 0379686 | 8/1990 | European Pat. Off. . |
| 0478313 | 4/1992 | European Pat. Off. . |
| 2227109 | 11/1974 | France . |
| 3913966 | 11/1989 | Germany . |
| 52-123334 | 10/1977 | Japan . |
| 4148590 | 5/1992 | Japan . |
| 1276527 | 6/1972 | United Kingdom . |

OTHER PUBLICATIONS

Search Report for European Appl. 93115712.7, (mailed Feb. 4, 1994).

Vergleichende Untersuchungen an Verschiedenen Vorbehandlungsmethoden fur Unkashierte; Leierplatten–Basismaterialien; vol. 74 (1983) Marz, No. 3, Saulgau Duetschland, pp. 269–274.

Primary Examiner—Peter Vo
Attorney, Agent, or Firm—Renner, Otto, Boisselle & Sklar

[57] ABSTRACT

A dry sandblasting treatment for spraying abrasives onto a surface of an insulating resin layer, a chemical etching for chemically etching the surface, and a plating process for plating a conductive layer on the resulting insulating resin layer are successively performed. Since the surface of the insulating resin layer is roughened by the dry sandblasting treatment and the resulting surface is subjected to the chemical etching, a minute anchor structure is formed on the surface. Accordingly, the adhesion between the insulating resin layer and a plating layer (i.e., a circuit conductive layer) is improved. Due to the dry sandblasting treatment, the shape of a via hole formed in the insulating resin layer is improved, and an exposed surface of the circuit conductor layer and an inner wall of a through-hole are cleaned.

23 Claims, 6 Drawing Sheets

PLATING METHOD AND METHOD FOR PRODUCING A MULTI-LAYERED PRINTED WIRING BOARD USING THE SAME

BACKGROUND OF THE INVENTION

1. Field of the Invention

The present invention relates to a multi-layered printed wiring board used for electronic devices and the production method thereof. More particularly, the present invention relates to a plating method for electrically connecting circuit conductor layers to one another through via holes formed in an insulating resin layer, after alternatively laminating the circuit conductor layer and the insulating resin layer, the production method for a multi-layered printed wiring board including the placing method, and the multi-layered printed wiring board produced by such methods.

2. Description of the Related Art

The conventional production methods for a multi-layered printed wiring board are described in, for example, Japanese Laid-Open Patent Publication No. 4-148590. The Japanese Laid-Open Patent Publication No. 4-148590 discloses a production method for a multi-layered wiring board comprising the steps of forming a first circuit conductor layer by etching a copper foil provided on the top and bottom surfaces of an insulating substrate; forming an insulating resin layer having photo via holes on the first circuit conductor layer; chemically roughening the surface of the insulating resin layer after forming through-holes in the insulating substrate; and forming a second circuit conductor layer on the roughened surface of the insulating resin layer by an electroless copper plating method and an electrolytic copper plating method so as to electrically interconnect the first and second circuit conductor layers to each other through the photo via holes and the through-holes.

In this conventional method, the chemical etching treatment mainly using potassium permanganate is performed as a pretreatment for forming the electroless copper plating layer on the insulating resin layer. The chemical etching treatment has an objective to form minute irregularities on the surface of the insulating resin layer by chemical etching, thereby improving the adhesion of the electroless plating layer to the Insulating resin layer.

The above-mentioned conventional technique, however, still cannot attain sufficient adhesion between the insulating resin layer and the electroless copper plating.

Further, the reliability of the electrical connection within the blind via holes and the through-holes by the electroless plating is not sufficient.

SUMMARY OF THE INVENTION

A method for plating a conductive layer on an insulating resin layer according to the present invention comprises the steps of forming the insulating resin layer; spraying abrasives onto a surface of the insulating resin layer to perform a dry sandblasting treatment; chemically etching the surface of the insulating resin layer subjected to the dry sandblasting treatment; and plating the conductive layer on the surface of the insulating resin layer subjected to the chemical etching.

In one embodiment of the invention, the dry sandblasting treatment comprises a step of spraying aluminum abrasives onto the surface of the insulating resin layer by a dry spraying method.

In another embodiment of the invention, the dry sandblasting treatment comprises a step of spraying abrasives of silicon carbide onto the surface of the insulating resin layer by the dry spraying method.

In still another embodiment of the invention, a cleaning step of removing the abrasives from the surface of the insulating resin layer is performed between the dry sandblasting treatment and the chemical etching.

In still another embodiment of the invention, the cleaning step comprises an ultrasonic cleaning step.

In still another embodiment of the invention, a step of making catalyst particles used for the plating step absorb onto the surface of the insulating resin layer is performed after the chemical etching.

Alternatively, a method for producing a multi-layered printed wiring board of the invention comprises the steps of forming a multi-layered wiring board by forming at least one inner circuit conductor layer on each top and bottom surface of a substrate; forming an insulating resin layer to cover the top and bottom surfaces of the multi-layered wiring board; forming via holes at desired positions of the insulating resin layer, and forming through holes penetrating the multi-layered wiring board at desired positions of the multi-layered wiring board; spraying abrasives at least onto a surface of the insulating resin layer and inner faces of the through holes to perform a dry sandblasting treatment; chemically etching the surface of the insulating resin layer; plating a conductive layer on the surface of the insulating resin layer subjected to the chemical etching and on the inner face of the through hole; and patterning the conductive layer into a desired pattern.

In one embodiment of the invention, the dry sandblasting treatment comprises a step of spraying aluminum abrasives onto the surface of the insulating resin layer and the inner faces of the through holes by the dry spraying method.

In another embodiment of the invention, the dry sandblasting treatment comprises a step of spraying abrasives of silicon carbide onto the surface of the insulating resin layer and the inner faces of the through holes by the dry spraying method.

In still another embodiment of the invention, a cleaning step of removing the abrasives from the surface of the insulating resin layer is performed between the dry sandblasting treatment and the chemical etching.

In still another embodiment of the invention, the cleaning step comprises an ultrasonic cleaning step.

In still another embodiment of the invention, a step of making catalyst particles used for the plating step absorb on the surface of the insulating resin layer is performed after the chemical etching.

In still another embodiment of the invention, the step of forming the multi-layered wiring board comprises a step of alternately repeating the formation of the inner circuit conductor layer and the formation of an insulating layer to cover the inner circuit conductor layer.

In still another embodiment of the invention, the step of forming the inner conductor layer comprises a step of forming a resistance factor formed of a resistor film to be electrically connected to the circuit conductor layer.

In still another embodiment of the invention, the sandblasting treatment is a step of forming irregularities having roughness in the range of 5 to 12 μm on the surface of the insulating resin layer.

Alternatively, a method for producing a multi-layered printed wiring board comprises the steps of forming an inner circuit conductor layer on each top and bottom surface of a substrate; forming through-holes penetrating the inner conductor layer and the substrate; electrically connecting the inner circuit conductor layer formed on the top surface of the substrate to the inner circuit conductor layer formed on the bottom surface of the substrate through the through-holes; filling the through-holes with a resin; forming an insulating resin layer to cover the inner circuit conductor layer; forming via holes at desired positions of the insulating resin layer; spraying abrasives at least onto a surface of the insulating resin layer to perform a sandblasting treatment; chemically etching the surface of the insulating resin layer; plating a conductive layer on the surface of the insulating resin layer subjected to the chemical etching; and patterning the conductive layer into a desired pattern.

In one embodiment of the invention, the resin used for filling the through-holes is made from an insulating resin.

In another embodiment of the invention, the resin used for filling the through-holes is made from a conductive resin.

In still another embodiment of the invention, the dry sandblasting treatment comprises a step of spraying aluminum abrasives onto the surface of the insulating resin layer by a dry spraying method.

In still another embodiment of the invention, the sandblasting treatment comprises a step of spraying abrasives of silicon carbide on the surface of the insulating resin layer.

In still another embodiment of the invention, a cleaning step of removing the abrasives from the surface of the insulating resin layer is performed between the dry sandblasting treatment and the chemical etching.

In still another embodiment of the invention, the cleaning step comprises an ultrasonic cleaning step.

In still another embodiment of the invention, a step of making catalyst particles used for the plating step absorb on the surface of the insulating resin layer is performed after the chemical etching.

Alternatively, a multi-layered printed wiring board comprises a substrate having top and bottom surfaces; first circuit conductor layers respectively formed on the top and bottom surfaces of the substrate; insulating resin layers to cover the top and bottom surfaces of the substrate; via holes formed at desired positions of the insulating resin layer; through holes penetrating the substrate formed at desired positions of the substrate; second circuit conductor layers formed on the insulating resin layers and the inner walls of the through holes, connected to the first circuit conductor layers through the via holes; wherein the surface of the insulating resin layer has irregularities reflecting the shapes of minute abrasives and the distribution of the irregularities is isotropic along the surface.

In one embodiment of the invention, a multi-layered wiring board, wherein the surface of the insulating resin layer has roughness Rmax in the range of 5 to 12 μm.

In another embodiment of the invention, a multi-layered wiring board, wherein the insulating resin layer is formed of a material including resin mixed with fine powder of silica.

In still another embodiment of the invention, a multi-layered wiring bard, wherein the insulating resin layer is formed of a material including an ultraviolet-hardened resin layer or a thermosetting resin mixed with fine powder of silica.

Thus, the invention described herein makes possible advantages of (1) providing a plating method for forming a plating layer having an excellent adhesion to an insulating resin layer and (2) providing a method for forming a multi-layered wiring board having an excellent adhesion between a circuit conductor layer and the underlaying insulating resin layer in addition to reliability of making the via holes and through-holes very conductive.

These and other advantages of the present invention will become apparent to those skilled in the art upon reading and understanding the following detailed description with reference to the accompanying figures.

DESCRIPTION OF THE PREFERRED EMBODIMENTS

The present invention will now be described by way of examples, with reference to the accompanying drawings.

Figure 1A:
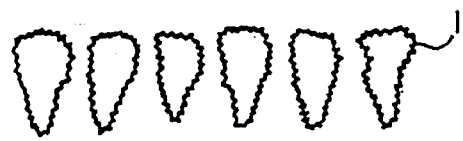
FIGS. 1A to 1D are cross-sectional views showing a plating method according to the present invention.

With reference to FIGS. 1A to 1D, a planting method of the present invention will be described. A plurality of spalled grain-shaped abrasives 1 having complicated shapes as is shown in FIG. 1A are used in this method. These abrasives 1 are used for a sandblasting treatment of an insulating resin layer which will be described in detail. Examples of the abrasives 1 include spalled grain-shaped alumina and silicon carbide inorganic powder both having a grain diameter in the range of #80 to #320 (ISO standard).

Next, the plurality of abrasives 1 are sprayed onto a surface of an insulating resin layer 2 by a dry spray method using compressed air. This process is referred to as a dry sandblasting treatment.

Figure 1B:
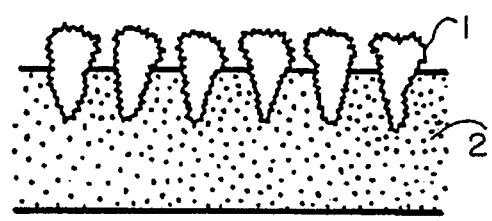

By the dry sandblasting treatment, part of the abrasives 1 are sunk into the surface of the insulating resin layer 2 as shown in FIG. 1B. Many of the abrasives 1 which have not been sunk into the insulating resin layer 2 also hit the surface and remain thereon (not shown). In a wet spraying method in which a liquid material including the abrasives is sprayed onto the insulating resin layer, the insulating resin layer is covered with the liquid material, so that the abrasives have a difficulty in sinking into the insulating resin layer. Accordingly, the wet spray method is not suitable for the present invention.

Figure 1C:
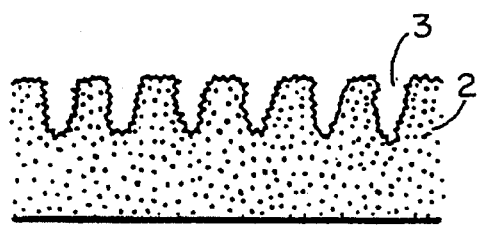

Next, both the abrasives 1 having sunk into the surface of the insulating resin layer 2 and the abrasives 1 remaining on the surface thereof are removed by a cleaning process. An air method and/or an ultrasonic cleaning method can be used for the cleaning process. Preferably, substantially all the abrasives 1 are removed from the surface of the insulating resin layer 2. Thus, the surface of the insulating resin layer 2 becomes rough as shown in FIG. 1C. Part of the complicated shapes of the abrasives 1 are transferred onto the surface of the insulating resin layer 2. As a result, the shape of the insulating resin layer 2 reflects the shape of the abrasives 1. Herein, the structure formed on the surface of insulating resin layer 2 as is shown in FIG. 1C is referred to as an "anchor structure". The roughness of the insulating resin layer 2, i.e., the specific shape of the anchor structure, varies depending on various factors, such as the material, the shape, and the grain size of the abrasive 1; the material of the insulating resin layer 2; and the condition for spraying the abrasives 1. Further, it is understood that even the abrasives 1 not having sunk into the surface of the insulating resin layer 2 contribute to the formation of the anchor structure by hitting the surface of the insulating resin layer 2.

According to the method of the present invention, the distribution of the irregularities formed on the surface of the insulating resin layer 2 (the anchor structure) is isotropic along the surface thereof. If the surface of the insulating resin layer 2 is ground with a sandpaper or the like, a plurality of line-shaped grooves are formed in a certain direction thereon. Herein, such a structure ks not included in the "anchor structure". Since the anchor structure obtained by the present method has a plurality of irregularities, the surface area of the insulating resin layer 2 is larger than that of the structure having a plurality of line-shaped grooves.

It is preferable that the insulating resin layer 2 be made from a flexible and elastic material, so that the abrasives 1 can be readily sunk into the insulating resin layer 2. When more abrasives 1 are more deeply sunk into the insulating resin layer 2, a more complicated anchor structure is formed thereon, resulting in a larger rough surface area. This improves the adhesion between the insulating resin layer 2 and a plating layer formed in the subsequent process. In this example, the resulting resin layer 2 is made from an ultra-violet-hardened epoxy resin mixed with approximately 20 wt % of fine powder of silicon. This material is relatively flexible and elastic, having a glass transition temperature of 117° C. When the insulating resin layer 2 made from this material is subjected to the dry sandblasting treatment, at a spray pressure of 3 to 4 kg/cm$^2$, the irregularities having a roughness Rmax of 5 to 12 µm are formed on the insulating resin layer 2.

Next, the resulting insulating resin layer 2 having the rough surface is dipped into a chromic acid-sulfuric acid type solution or a powerful oxidizing solution including potassium permanganate or the like. In this manner, part of the surface of the insulating resin layer 2 made from the epoxy resin are chemically etched. Such a chemical etching provides irregularities having a smaller roughness than that of the irregularities obtained by the dry sandblasting treatment. As a result, the surface area of the insulating resin layer 2 becomes larger and the adhesion is further increased.

Figure 2:
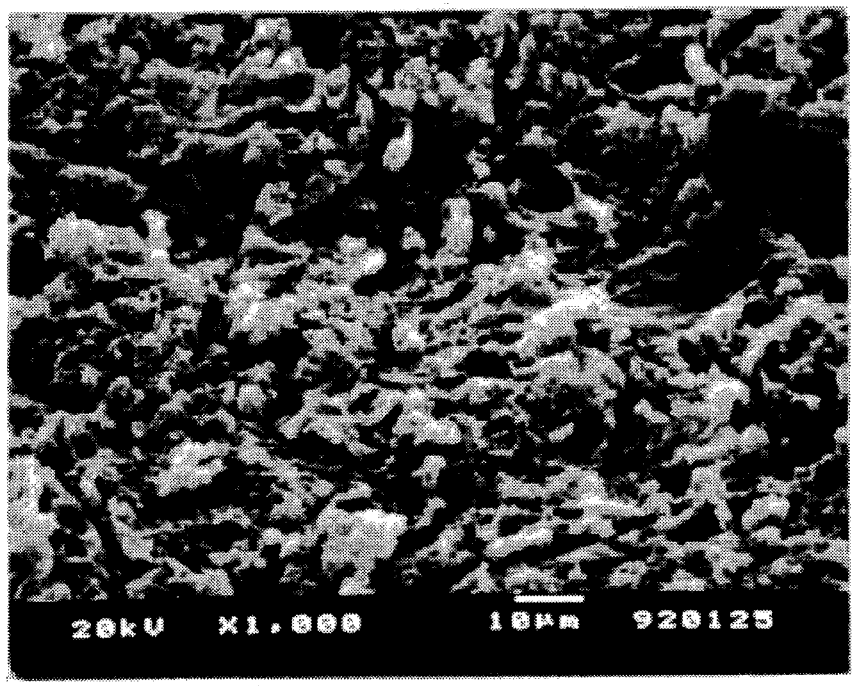
FIG. 2 shows a copy of a microphotograph of a surface of an insulating resin layer, after being subjected to the sandblasting treatment using abrasives having a grain diameter of #120 and the consequent chemical etching.
Figure 3:
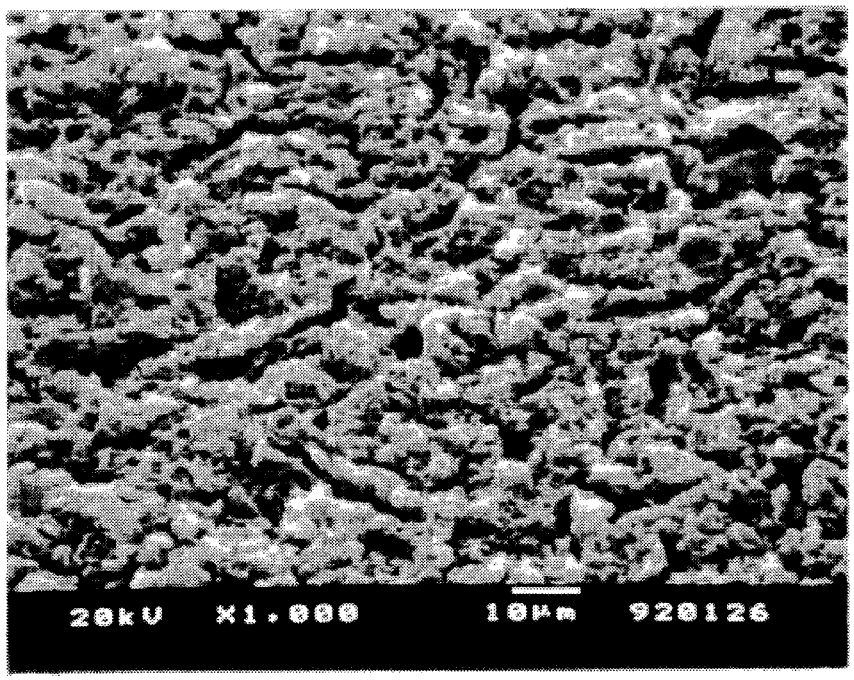
FIG. 3 shows a copy of s microphotograph of the surface of an insulating resin layer, after being subjected to the sandblasting treatment using abrasives having a grain diameter of #240 and the consequent chemical etching.
Figure 4:
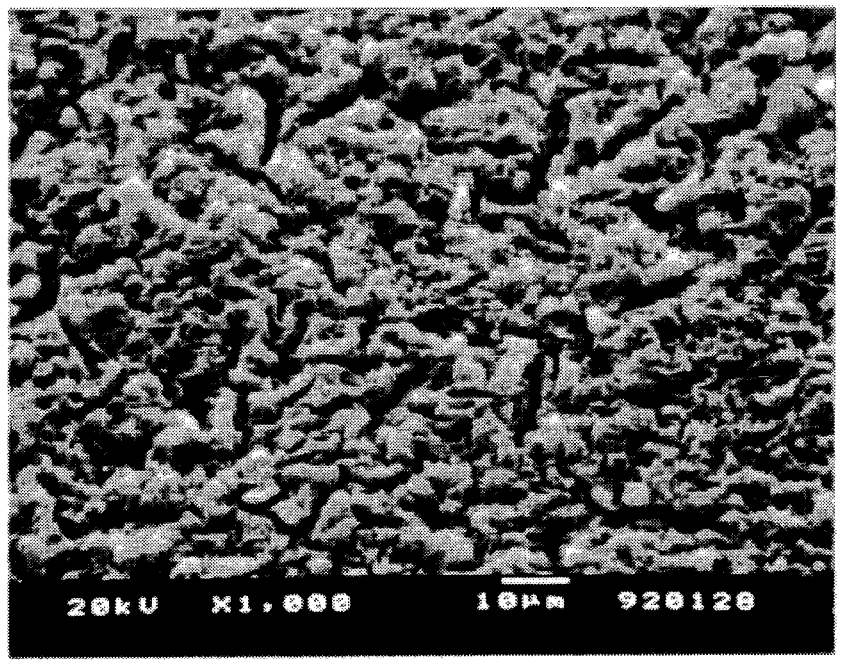
FIG. 4 is a copy of a microphotograph of the surface of an insulating resin layer after the sandblasting treatment using abrasives having a grain diameter of #320 and the consequent chemical etching.
Figure 5:
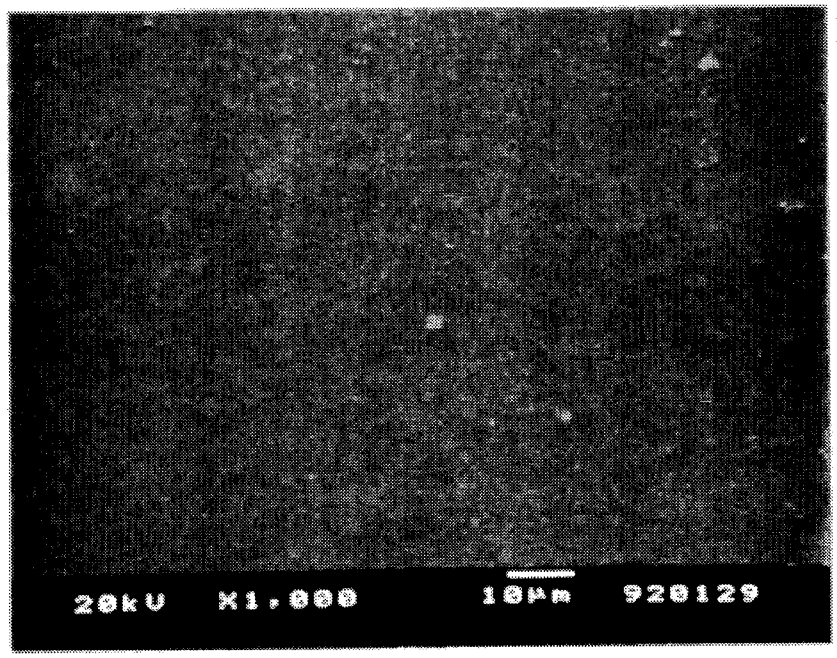
FIG. 5 is a copy of a microphotograph of the surface of an insulating resin layer without the sandblasting treatment.
Figure 6:
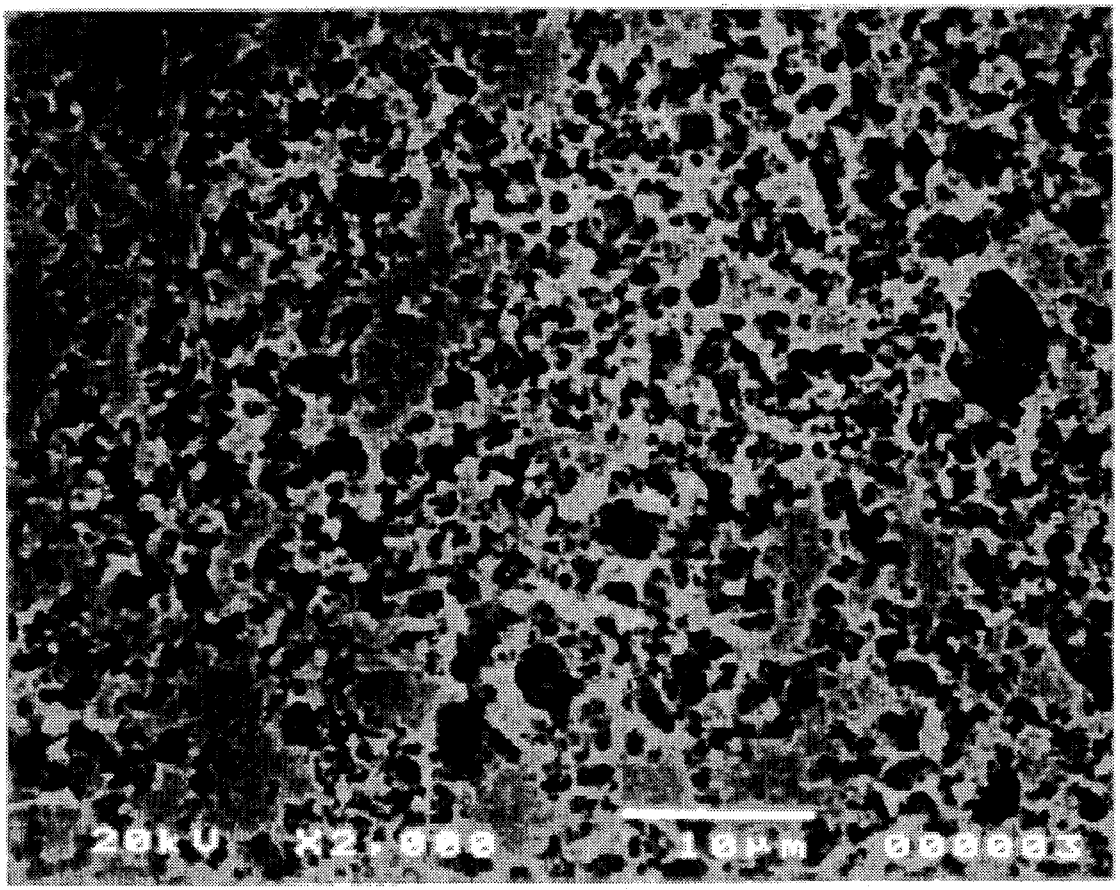
FIG. 6 shows a copy of a microphotograph of the surface of an insulating resin layer after three desmear treatments.

FIGS. 2 to 4 are copies of microphotographs of the surfaces of insulating resin layers, after the dry sandblasting treatment and the chemical etching. In more detail, FIGS. 2, 3 and 4 show the insulating resin layers subjected to the dry sandblasting treatments using abrasives having the grain diameters of #120, #240 and #320, respectively. In addition, FIG. 5 is a copy of a microphotograph of an insulating resin layer with no dry sandblasting treatment, and FIG. 6 is a copy of a microphotograph of an insulating resin layer subjected to three desmear treatments. As can be seen from these microphotographs, irregularities of the insulating resin layer (the anchor structure) can be made more complicated by the chemical etching followed by the dry sandblasting treatment than those obtained without the dry sandblasting treatment or by the desmear treatment.

Figure 1D:
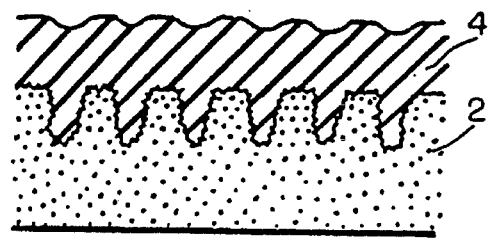

Next, the resulting insulating resin layer 2 is dipped into a hydrochloric acidic solution including tin chloride and palladium chloride so as to be activated. By this activating treatment, fine particles of metal palladium (not shown), which are to be used as catalyst cores for the electroless plating, are absorbed up on the surface of the insulating resin layer 2. The insulating resin layer 2 is then dipped into an electroless copper plating solution including formalin and an alkalic solution of copper complex salt. Thus, metal copper is grown to be a thin layer having a thickness of approximately of 1 µm by the electroless copper plating and then by the electrolytic copper plating, the resulting metal copper is regrown to have a desired thickness. In this manner, a conductive metal layer 4 is formed on the insulating resin layer 2 as shown in FIG. 1D.

Table 1 described below shows roughness of the surface of an insulating resin layer and the peeling strength of the conductive metal layer obtained by an abrasive each having the listed grain size. As is shown in Table 1, a higher peeling strength can be achieved by the plating method of the present invention than those attained by the conventional method.

TABLE 1

Relationship between Roughness of Surface and Peering Strength

| Grain Diameter of Abrasives | Roughness of Surface | Peeling Strength |
| --- | --- | --- |
| #80 | Rmax 12 µm | 1.8 kg/cm |
| #120 | Rmax 10 µm | 1.5 kg/cm |
| #180 | Rmax 8 µm | 1.4 kg/cm |
| #240 | Rmax 6 µm | 1.2 kg/cm |
| #320 | Rmax 5 µm | 1.0 kg/cm |
| conventional example | — | 0.8 kg/cm |

The adhesion (i.e., the peeling strength) of the conductive metal layer 4 (i.e., the plating layer) to the insulating resin layer 2 is improved by the plating method of the present invention, mainly because the complicated anchor structure can be formed on the surface of the insulating resin layer 2 as shown in FIGS. 1C and 2 to 4. Another reason is as follows A surface resin component of the inner wall of the recess shown in FIG. 1C is selectively etched by the chemical etching. As a result, the fine powder of silica included in the insulating resin layer 2 can appear as microscopic projections on the insulating resin layer 2, because silica is unlikely to be etched under the condition of the chemical etching. These microscopic projections are sunk into the surface of the conductive metal layer 4, thereby further improving the adhesion.

The surface of the insulating resin layer 2 roughened by the dry sandblasting treatment is in an extremely activated state, thereby improving the absorption of palladium into the insulating resin layer 2 in the above-mentioned activating treatment. As a result, in the electroless copper plating, metal copper is more uniformly deposited on the insulating resin layer 2, thereby improving the adhesion of the conductive metal layer 4 to the insulating resin layer 2.

The production method for a multi-layered printed wiring board according to the present invention will now be described below with reference to FIGS. 7A to 7F. In this example, the production process for a multi-layered printed wiring board having a four-layered circuit conductor layer will be described.

Figure 7A:
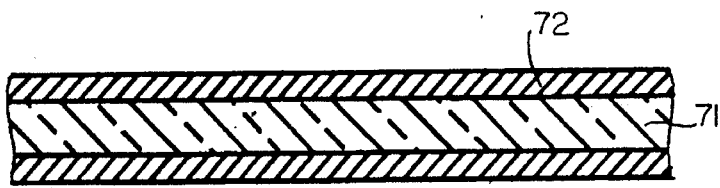
FIGS. 7A to 7F are cross-sectional views showing a main production process of a multi-layered printed wiring board according to the present invention.
Figure 7B:
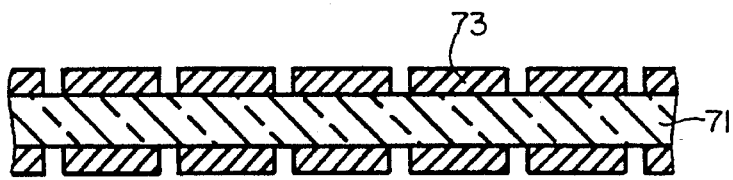

As is shown in FIG. 7A, so-called a copper-clad laminated substrate comprising an insulating substrate 71 such as a glass epoxy laminated board bearing a copper foil 72 with a thickness of 1 ounce or a half ounce on each surface is used in this example. Unnecessary portions of the copper foil 72 is selectively etched by a known technique such as the photoetching. Thus, a first circuit conductor layer 73 having a desired pattern is formed on each surface of the insulating substrate 71 as is shown in FIG. 7B.

Next, an insulating resin layer 74 is applied on each surface of the insulating substrate 71 so as to cover the first circuit conductor layer 73. The insulating resin layer 74 is required to be a resin layer having excellent characteristics, such as electrical insulation, heat resistance, and chemical resistance. In this example, an insulating paste, obtained by mixing an ultraviolet-hardened epoxy resin with inorganic powder, such as alumina and silica, and then adjusting the viscosity thereof, is used as the insulating resin layer 74. The insulating paste having a thickness of 80 to 120 μm is formed by a screen printing method or a curtain coating method. The above-mentioned objective is thus achieved.

Figure 7C:
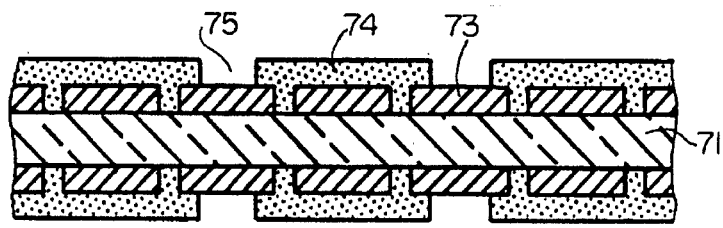

After drying the insulating resin layer 74, a mask film is attached thereto. The resulting insulating resin layer 74 is irradiated with UV rays through the mask film. The mask film has a pattern for defining positions and shapes of via holes 75. Next, unirradiated portions of the insulating resin layer 74 are selectively etched by a developing treatment. Thus, the via holes 75 are formed at desired positions of the insulating resin layers 74 as is shown in FIG. 7C. After that, the insulating resin layers 74 are heated at 150° C. for 60 minutes for further hardening.

There is another method for forming the via holes 75 as follows: the insulating resin layer 74 is covered with a thermosetting epoxy resin having high heat resistance mixed with an inorganic filler. Then, the via holes 75 are formed at the desired positions of the resulting insulating resin layer 74 by YAG laser or eximer laser.

Figure 7D:
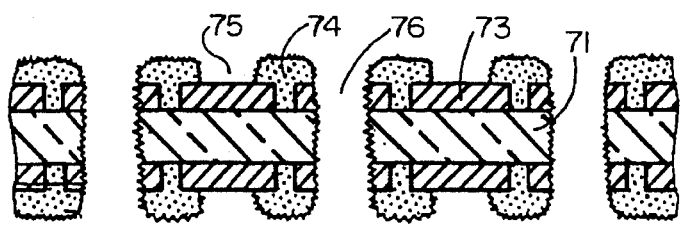

Next, as is shown in FIG. 7D, through-holes 76 are formed at desired positions of the insulating substrate 71 by drilling, and then the insulating substrate 71 is subjected to the dry sandblasting treatment and the chemical etching. These surface treatments are performed in the same way as the treatment described referring to FIGS. 1A to 1D as follows: powder such as alumina and silica having a complicated shape is used as the dry sandblasting abrasive and is sprayed onto the insulating resin layer 74 at the pressure of 3 to 4 kg/cm² by the dry spray. As a result, the insulating resin layer 74 has a rough and complicated-shaped surface. Then, the insulating resin layer 74 is etched in a potassium permanganate solution to form the anchor structure having a microscopic rough surface on the insulating resin layer 74. The surface of the insulating resin layer 74, the inner walls of the via holes 75 and the through-holes 76 are roughened by a series of surface treatments.

As a result of the evaluation of the electrical insulation characteristics and the adhesion of the electroless copper planting, the following has been founded it is preferable that the roughness Rmax of the surface is adjusted in the range of 5 to 12 μm by the dry sandblasting treatment because this is the optimal condition to improve the conductor adhering strength by the electroless copper plating without degrading the electrical insulation characteristics.

Figure 7E:
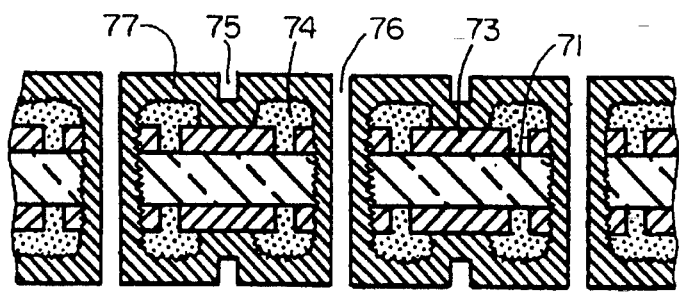

Next, the insulating substrate 71 having the rough surface is dipped into an activating solution including a hydrochloric acidic chloride solution of stannous chloride and palladium chloride so as to attach the catalyst cores made from fine particles of metal palladium thereto. Then, a conductive metal layer 77 made from metal copper is formed on the entire surface of the insulating resin layer 74 including the through-holes 76 by the electroless copper planting, and a conductive metal layer is further formed thereon by electrolytic copper plating, if necessary. Thus, the structure shown in FIG. 7E is obtained.

Figure 7F:
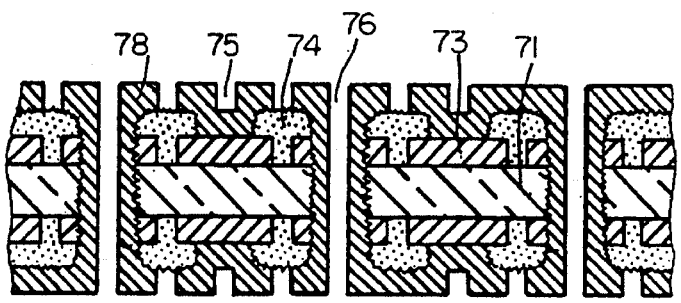

Next, unnecessary portions of the conductive metal layer 77 are selectively,etched by a known method such as photoetching, thereby forming a second circuit conductor layer 78 on the insulating resin layer 74. Thus, as is shown in FIG. 7F, the multi-layered printed wiring board having the four-layered structure in which the first and second circuit conductor layers 73 and 78 are electrically connected to each other through the via holes 75 and the through-holes 76 is obtained. The first and second circuit conductor layer 73 and 78 work as an inner circuit conductor layer and the outer circuit conductor layer, respectively.

In this example, the surface of the insulating resin layer 74 in the multi-layered printed wiring board is roughened by both a mechanical method using the dry sandblasting treatment and the wet chemical etching using an oxidant. Thus, minute irregularities having a complicated shape and high density are formed on the insulating resin layer 74, thereby obtaining an excellent anchor structure. According to this example, the adhesion of the electroless copper plating can be improved. Further, at the corners of the through-holes 76 and the via holes 75, appropriate tapers can be formed. Further, the exposed surface of the first circuit conductor layer 73 and the inner wall of the through-holes 76 can be cleaned. As a result, the adhesion and the throwing power of electrolytic coloring of the electroless copper plating are significantly improved, thereby providing a multi-layered printed wiring board having an excellent reliability in the electrical connection between the circuit conductor layers.

In this example, the production method for the multi-layered printed wiring board having the four-layered structure is described. However, a printed wiring board having more layers can also be obtained by the repetition of the above-mentioned procedures.

In this example, a synthetic resin layer substrate such as a glass epoxy laminated board is used for the insulating substrate 71. However, the method for the insulating substrate is not limited to this, but ceramic such as alumina and insulated metal such as alumina, copper, iron and stainless can be used. When these materials are used, the first circuit conductor layer 73 can be formed as follows instead of adhering a copper foil on the insulating substrate. An insulating substrate is coated with an adhesive, and a conductive metal layer is directly formed thereon by the electroless copper plating or electrolytic copper plating. Then, the circuit conductor layer is formed by a known technique such as the photoetching.

Figure 8A:
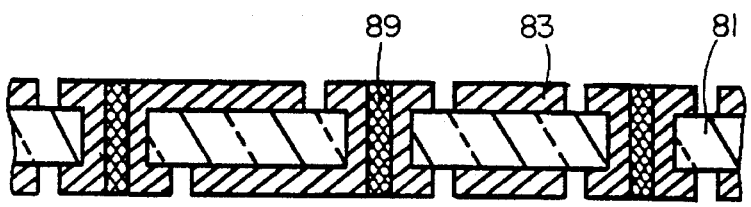
FIGS. 8A and 8B are cross-sectional views showing the production method for a multi-layered printed wiring board having through-holes according to the present invention.
Figure 8B:
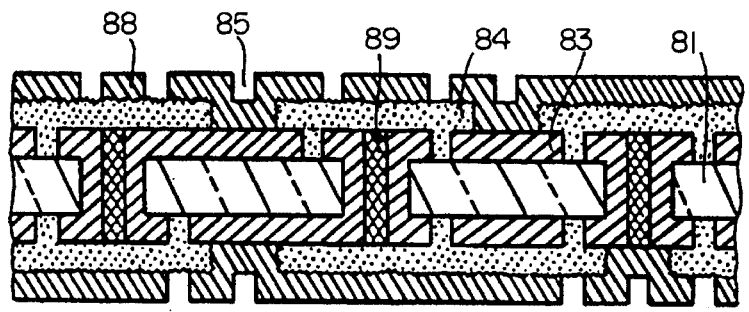

FIGS. 8A and 8B show a second example of the present invention. This example relates to production methods for a through-hole wiring board and a high-density multi-layered printed wiring board using the through-hole wiring board as a core substrate. In the through-hole wiring substrate, through-holes are filled with a filler.

In FIG. 8A, a metal copper foil is adhered to each substrate of an insulating substrate 81 made from a glass epoxy laminated plate, and etched to form a circuit conductor layer 83 as an inner layer. After forming through-holes 86 penetrating the circuit conductive layer 83, the inner wall of the through-hole 86 is made conductive by through-hole plating. Then, the through-holes 86 are filled with a filler 89. The wiring substrate of this example is thus fabricated.

An ultraviolet-hardened or thermosetting epoxy resin or acrylic resin is used as the filler 89. Further, paste including insulating inorganic powder such as alumina and silica or paste including conductive powder such as copper and silver can be mixed in the filler 89. In this case, the pastes are filled in the conductive through-holes 86 by the screen printing or the like. Further, conductor layers for connection are formed on the top and bottom surfaces of the filler 89, if necessary.

An insulating layer 84 and via holes 85 are formed at desired positions in the same way as in the first example. Then, the surface of the insulating resin layer 84 is toughened by both the dry sandblasting method and the chemical etching using potassium permanganate. A conductive metal layer is formed thereon by the electroless plating and the electrolytic plating. Finally, a circuit conductor layer 88 is formed as the outmost layer on the resulting substrate by the photoetching. The above-mentioned layers and via holes are formed on the top and bottom surfaces of the through-hole wiring substrate, resulting in the multi-layered printed wiring board as shown in FIG. 8B.

Since the through-hole is not exposed in this multi-layered printed wiring plate, the wiring pattern on the outmost layer is designed more freely, thereby obtaining a multi-layered wiring board having a high density.

In this example, the through-hole wiring substrate is used as the core substrate, however, the core substrate is not limited to this. The core substrate can be a multi-layered wiring board whose conductive through-holes are filled and which has optional numbers of circuit conductor layers as the inner layer comprising a pre-preg insulating sheet and a copper foil.

A third example of the present invention will be described with reference to FIGS. 9A and 9B.

A first circuit conductor layer 93 is formed on each surface of an insulating substrate 91 in the above-mentioned manner. Then, resistor film 100 is formed on at least one of the surfaces of the insulating substrate 91 to form a resistance-forming substrate (the core substrate) as shown in FIG. 9A. The resistor film 100 is formed as follows: the insulating substrate 91 is coated with a carbon resin resistor paste by the screen printing, and hardened with heat. Then, the shape of the resistor film 100 is adjusted by laser trimming and the resistance value of the resistor film 100 is adjusted. Alternatively, metal resistor film can be formed as the resistor film 100 by the electroless plating method.

Figure 9A:
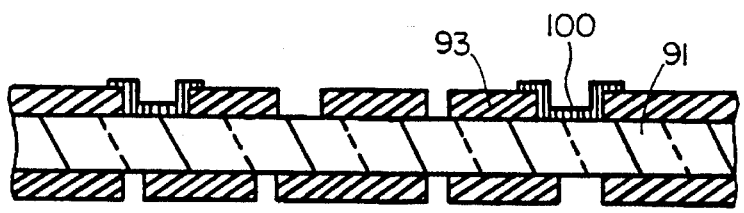
FIGS. 9A and 9B are cross-sectional views showing the production method for a multi-layered printed wiring board having a resistor film therein according to the present invention.
Figure 9B:
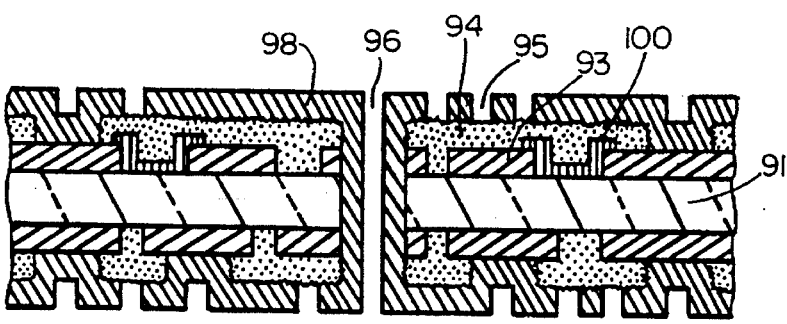

Next, the procedures as shown in FIGS. 7A to 7F are performed, using the core substrate shown in FIG. 9A. More specifically, an insulating resin layer 94 is coated on each surface of the core substrate, and then via holes 95 and through-holes 96 are formed in the core substrate. Then, the surface of the insulating resin layer 94 and the inner walls of the via hole 95 and the through-hole 96 are appropriately roughened by the dry sandblasting treatment and the chemical etching using a potassium permanganate solution. Then, a conductive metal layer is formed on the entire surface of the substrate by the electroless copper plating and the electrolytic copper plating. A second circuit conductor layer 98 is then formed by a known technique such as the photoetching. Thus, the multi-layered printed wiring board having the substrate as shown in FIG. 9B can be fabricated.

According to the method of the present invention, the dry sandblasting treatment for spraying abrasives onto an insulating resin layer and the chemical etching for chemically etching the resulting surface are performed before plating a conductive layer. Due to both the dry sandblasting treatment and the chemical etching, a complicated shape of the abrasive is transferred on the surface of the insulating resin layer, resulting in a great increase in the surface area. Further, due to the dry sandblasting treatment, the shapes of the via holes formed at the insulating resin layer are improved, thereby cleaning the exposed surface of the circuit conductor layer and the inner walls of the through-holes.

According to the method of the present invention, a surface of an insulating resin layer is mechanically roughened by the dry sandblasting treatment, and subjected to the chemical etching. Due to this, at least the following advantages can be obtained.

(1) A minute anchor structure is formed on the insulating resin layer, so that the adhesion between the insulating layer and a plating layer (i.e., a circuit conductor layer) formed thereon can be improved.

(2) Due to the dry sandblasting treatment, the shapes of the via holes formed in the insulating layer are improved and also an exposed surface of the circuit conductor layer and the inner walls of the through-holes are cleaned. Accordingly, the electrical connection between the circuit conductor layers by the electroless copper plating becomes stable, thereby obtaining the reliability of excellent electrical characteristics.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for plating a conductive layer on an insulating resin layer, comprising the steps of:

forming the insulating resin layer;

dry sandblasting abrasives onto a surface of the insulating resin layer;

removing the abrasives from the surface of the insulating resin layer, wherein the removing step comprises an ultrasonic cleaning step;

chemically etching the surface of the insulating resin layer subjected to the dry sandblasting treatment; and plating the conductive layer on the surface of the insulating resin layer subjected to the chemical etching.

2. A method according to claim 1, wherein the dry sandblasting treatment comprises a step of spraying aluminum abrasives onto the surface of the insulating resin layer by a dry spraying method.

3. A method according to claim 1, wherein the dry sandblasting treatment comprises a step of spraying abrasives of silicon carbide onto the surface of the insulating resin layer by the dry spraying method.

4. A method according to claim 1, wherein a step of making catalyst particles used for the plating step absorb onto the surface of the insulating resin layer is performed after the chemical etching.

5. A method for producing a multi-layered printed wiring board, comprising the steps of:

forming a multi-layered board by forming at least one inner circuit conductor layer on each top and bottom surface of a substrate;

forming an insulating resin layer to cover the top and bottom surfaces of the multi-layered board;

forming via holes in the insulating resin layer at desired positions on the multi-layered board, and forming through holes penetrating the multi-layered board at desired positions on the multilayered board;

dry sandblasting abrasives at least onto a surface of the insulating resin layer and inner faces of the through holes;

chemically etching the surface of the insulating resin layer;

plating a conductive layer on the surface of the insulating resin layer subjected to the chemical etching and on the inner face of the through hole; and patterning the conductive layer into a desired pattern, thereby forming the multi-layered printed wiring board.

6. A method according to claim 5, wherein the dry sandblasting treatment comprises a step of spraying aluminum abrasives onto the surface of the insulating resin layer and the inner faces of the through holes by a dry spraying method.

7. A method according to claim 5, wherein the dry sandblasting treatment comprises a step of spraying abrasives of silicon carbide onto the surface of the insulating resin layer and the inner faces of the through holes by a dry spraying method.

8. A method according to claim 5, wherein a cleaning step of removing the abrasives from the surface of the insulating resin layer is performed between the dry sandblasting treatment and the chemical etching.

9. A method according to claim 8, wherein the cleaning step comprises an ultrasonic cleaning step.

10. A method according to claim 5, wherein a step of making catalyst particles used for the plating step absorb on the surface of the insulating resin layer is performed after the chemical etching.

11. A method according to claim 5, wherein the step of forming the multi-layered wiring board comprises a step of alternately repeating the formation of the inner circuit conductor layer and the formation of an insulating layer so cover the inner circuit conductor layer.

12. A method according to claim 5, wherein the step of forming the inner conductor layer comprises a step of forming a resistance factor formed of a resistor film to be electrically connected to the circuit conductor layer.

13. A method according to claim 5, wherein the sandblasting treatment is a step of forming irregularities having roughness in the range of 5 to 12 μm on the surface of the insulating resin layer.

14. A method for producing a multi-layered printed wiring board, comprising the steps of:

forming an inner circuit conductor layer on each top and bottom surface of a substrate;

forming through-holes penetrating the inner conductor layer and the substrate;

electrically connecting the inner circuit conductor layer formed on the top surface of the substrate to the inner circuit conductor layer formed on the bottom surface of the substrate through the through-holes;

filling the through-holes with a resin; forming an insulating resin layer to cover the inner circuit conductor layer;

forming via holes in the insulating resin layer at desired positions on the multi-layered board;

dry sandblasting abrasives at least onto a surface of the insulating resin layer;

chemically etching the surface of the insulation resin layer;

plating a conductive layer on the surface of the insulating resin layer subjected to the chemical etching; and patterning the conductive layer into a desired pattern, thereby forming the multi-layered printed wiring board.

15. A method according to claim 14, wherein the resin used for filling the through-holes is made from an insulating resin.

16. A method according to claim 14, wherein the resin used for filling the through-holes is made from a conductive resin.

17. A method according to claim 14, wherein the dry sandblasting treatment comprises a step of spraying aluminum abrasives onto the surface of the insulating resin layer by a dry spraying method.

18. A method according to claim 14, wherein the sandblasting treatment comprises a step of spraying abrasives of silicon carbide on the surface of the insulating resin layer.

19. A method according to claim 14, wherein a cleaning step of removing the abrasives from the surface of the insulating resin layer is performed between the dry sandblasting treatment and the chemical etching.

20. A method according to claim 19, wherein the cleaning step comprises an ultrasonic cleaning step.

21. A method according to claim 14, wherein a step of making catalyst particles used for the plating step absorb on the surface of the insulating resin layer is performed after the chemical etching.

22. A method for producing a multi-layer printed wiring board, comprising the steps of:

forming a multi-layered board by forming at least one inner circuit conductor layer on a top and bottom surface of a substrate;

forming an insulating resin layer to cover the top and bottom surfaces of the multi-layered board;

forming via holes in the insulating resin layer at desired positions on the multi-layered board;

dry sandblasting abrasives at least onto a surface of the insulating resin layer and the inner faces of the via holes, thereby forming tapers at corners of the via holes;

chemically etching the surface of the insulating resin layer;

plating a conductive layer on the surface of the insulating resin layer and on the inner faces of the via holes; and patterning the conductive layer into a desired pattern, thereby forming the multi-layered printed wiring board.

23. A method according to claim 22, wherein the inner faces of the via holes include faces of the insulating resin layer and exposed surfaces of the first circuit conductor layer, the exposed surfaces of the first circuit conductor layer being roughened and cleaned by the dry sandblasting treatment.

* * * * *